United States Patent
Hively

[19]

[11] Patent Number: 5,955,762
[45] Date of Patent: Sep. 21, 1999

[54] MICROELECTRONIC PACKAGE WITH POLYMER ESD PROTECTION

[75] Inventor: James W. Hively, Sunnyvale, Calif.

[73] Assignee: LSI Logic Corporation, Milpitas, Calif.

[21] Appl. No.: 08/723,140

[22] Filed: Oct. 1, 1996

Related U.S. Application Data

[63] Continuation-in-part of application No. 08/595,021, Jan. 31, 1996.

[51] Int. Cl.$^6$ ............................................. H01L 23/62
[52] U.S. Cl. ......................... 257/355; 257/530; 257/738
[58] Field of Search ............................. 257/173, 355, 257/356, 357, 358, 359, 360, 361, 362, 363, 530, 738, 779, 780

[56] References Cited

U.S. PATENT DOCUMENTS

| | | | |
|---|---|---|---|
| 4,705,205 | 11/1987 | Allen et al. ........................... | 228/180.2 |
| 4,825,280 | 4/1989 | Chen et al. ........................... | 357/71 |
| 4,959,708 | 9/1990 | Henderson et al. ................... | 357/84 |
| 4,977,357 | 12/1990 | Shrier ................................... | 338/21 |
| 5,059,553 | 10/1991 | Berndlmaier et al. ............... | 257/780 |
| 5,132,774 | 7/1992 | Matsuura et al. .................... | 257/758 |
| 5,262,754 | 11/1993 | Collins ................................. | 338/21 |
| 5,329,423 | 7/1994 | Scholz ................................. | 257/738 |
| 5,334,857 | 8/1994 | Mennitt et al. ....................... | 257/48 |
| 5,414,284 | 5/1995 | Baxter et al. ........................ | 257/355 |
| 5,493,142 | 2/1996 | Randazzo et al. ................... | 257/328 |
| 5,500,605 | 3/1996 | Chang ................................... | 324/758 |
| 5,514,892 | 5/1996 | Countryman et al. ............... | 257/355 |
| 5,600,180 | 2/1997 | Kusaka et al. ....................... | 257/778 |
| 5,631,499 | 5/1997 | Hosomi et al. ...................... | 257/738 |

FOREIGN PATENT DOCUMENTS

| | | |
|---|---|---|
| 0 075 892 A2 | 4/1983 | European Pat. Off. . |
| 0 202 109 A2 | 11/1986 | European Pat. Off. . |
| 1.562.742 | 5/1968 | France . |
| 27 13 936 A1 | 10/1978 | Germany . |
| PCT/US95/08683 | 7/1995 | WIPO . |
| PCT/US95/08808 | 7/1995 | WIPO . |

Primary Examiner—Olik Chaudhuri
Assistant Examiner—Nathan K. Kelley

[57] ABSTRACT

A semiconductor package having positioned therein a protection layer which protects the integrated circuit chip from electrostatic discharge (ESD) damage. The protection layer is made of a material that has at steady state a high electrical resistance, but when a high ESD potential is applied to it, it becomes highly conductive. A preferred material is SurgX™, which is a polymer. The layer is positioned to shunt the potential away from the chip, and can be positioned operatively between a signal lead and a power plane or between different signal leads. That is, the protection layer can be sandwiched between the lead and the conductive member, or the lead can be within the layer. Another preferred construction incorporates the protection material in a tape construction as a thin layer sandwiched between and bonded to a layer of leads and a ground plane.

10 Claims, 8 Drawing Sheets

MICROELECTRONIC PACKAGE WITH POLYMER ESD PROTECTION

CROSS-REFERENCE TO RELATED APPLICATION

This is a continuation-in-part of copending application Ser. No. 08/595,021, filed Jan. 31, 1996, and whose entire contents are hereby incorporated by reference.

BACKGROUND OF THE INVENTION

The present invention generally relates to microelectronic devices, and more specifically to a microelectronic integrated circuit with a thin film electrostatic discharge (ESD) protection structure. It further relates to microelectronic packages having ESD protection.

In Metal Oxide Semiconductor (MOS) integrated circuits, input signals are applied to terminals which are connected to gates of MOS Field Effect Transistors (FETs). If the voltage applied to the gate insulator becomes excessive, the gate oxide can break down. The dielectric breakdown strength of $SiO_2$ is approximately $8 \times 10^6$ volts per centimeter. Thus, a fifteen nm gate oxide will not tolerate voltages greater than twelve volts without breaking down. Although this is well in excess of the normal operating voltages of five-volt integrated circuits, voltages higher than this may be impressed upon the inputs to the circuits during either human-operator or mechanical handling operations.

The main source of such voltages is triboelectricity (electricity caused when two materials are rubbed together). A person can develop a very high static voltage (i.e., a few hundred to a few thousand volts) simply by walking across a room or by removing an integrated circuit from its plastic package, even when careful handling procedures are followed. If such a high voltage is accidentally applied to the pins of an integrated circuit package, its discharge (referred to as electrostatic discharge, or ESD) can cause breakdown of the gate oxide of the devices to which it is applied. The breakdown event may cause sufficient damage to immediately destroy the device, or it may weaken the oxide enough that it will fail early in the operating life of the device, and thereby cause premature device failure.

All pins of MOS integrated circuits must be provided with protective circuits to prevent such voltages from damaging the MOS gates. The need for such circuits is also mandated by the increasing use of VLSI devices in such high noise environments as personal computers, automobiles, and manufacturing control systems.

These protective circuits, normally placed between the input and output pads on a chip and the transistor gates to which the pads are connected, are designed to begin conducting or to undergo breakdown, thereby providing an electrical path to ground (or to the power-supply rail). Since the breakdown mechanism is designed to be nondestructive, the circuits provide a normally open path that closes only when a high voltage appears at the input or output terminals, harmlessly discharging the node to which it is connected.

The prior art includes four main types of circuits for providing protection against ESD damages, more specifically: diode breakdown, node-to-node punchthrough, gate-field-induced breakdown, and parasitic pnpn diode (thyristor) latchup. These circuits are well known, and thus will not be discussed in detail herein. Often, a combination of protection methods is used, for example a breakdown diode and one of the other protection devices connected in parallel with the gate being protected. See, also International Applications PCT/US95/08808 and PCT/US95/08683, both published on Feb. 1, 1996, as International Publications WO 9602924 ('924) and WO 9602922, ('922), respectively, and hereby incorporated by reference in their entireties.

The prior art ESD protection circuits require that the integrated circuits be provided with additional elements such as diodes and thyristors for each terminal. This reduces the area on the circuits for devices which provide primary logical functionality, and increases the complexity and cost of the integrated circuits.

SUMMARY OF THE INVENTION

In accordance with one aspect of the present invention, a microelectronic package has an ESD protection layer therein. The layer is disposed operatively between a package lead and another conductive member to shunt the ESD potential to the conductive member and generally away from the integrated circuit die. The conductive member can be a power plane, a ground plane, a ground lead, or another signal lead. The protection layer is formed of a material, such as SurgX™, which although normally dielectric becomes temporarily conductive by application thereto of an ESD potential. When conductive, it provides a discharge path for the ESD potential to protect the integrated circuit chip. Advantageously, it then returns to its normal dielectric state wherein it does not interfere with the normal operation of the integrated circuit.

In accordance with another aspect of the present invention, microelectronic devices are formed on a substrate of an integrated circuit. An electrically conductive ground or power plane, and an ESD protection layer are formed on the substrate. Terminals such as solder balls or wire bond pads are formed on the substrate, and are electrically connected to the devices.

The protection layer is patterned such that portions thereof are disposed between the terminals and the plane to define vertical electrical discharge paths. The protection layer is formed of material such as SurgX™ which is normally dielectric, and is rendered conductive in the discharge paths by an electrostatic potential applied to the terminals during an ESD event to shunt the electrostatic potential from the terminals to the plane.

In other words, disclosed herein are microelectronic devices formed on a substrate of an integrated circuit. An electrically conductive ground or power plane, and an ESD protection layer are formed on the substrate. Terminals such as solder balls or wire bond pads are formed on the substrate, and are electrically connected to the devices. The protection layer is patterned such that portions thereof are disposed between the terminals and the plane to define vertical electrical discharge paths. The protection layer is formed of a material which is normally dielectric, but is rendered conductive in the discharge paths by an electrostatic potential applied to the terminals during an ESD event to shunt the electrostatic potential from the terminals to the plane. The protection layer, alternatively, can be formed between the terminals to define lateral discharge paths.

These and other features and advantages of the present invention will be apparent to those skilled in the art from the following detailed description, taken together with the accompanying drawings, in which like reference numerals refer to like parts.

DETAILED DESCRIPTION OF PREFERRED EMBODIMENTS OF THE INVENTION

Figure 1:
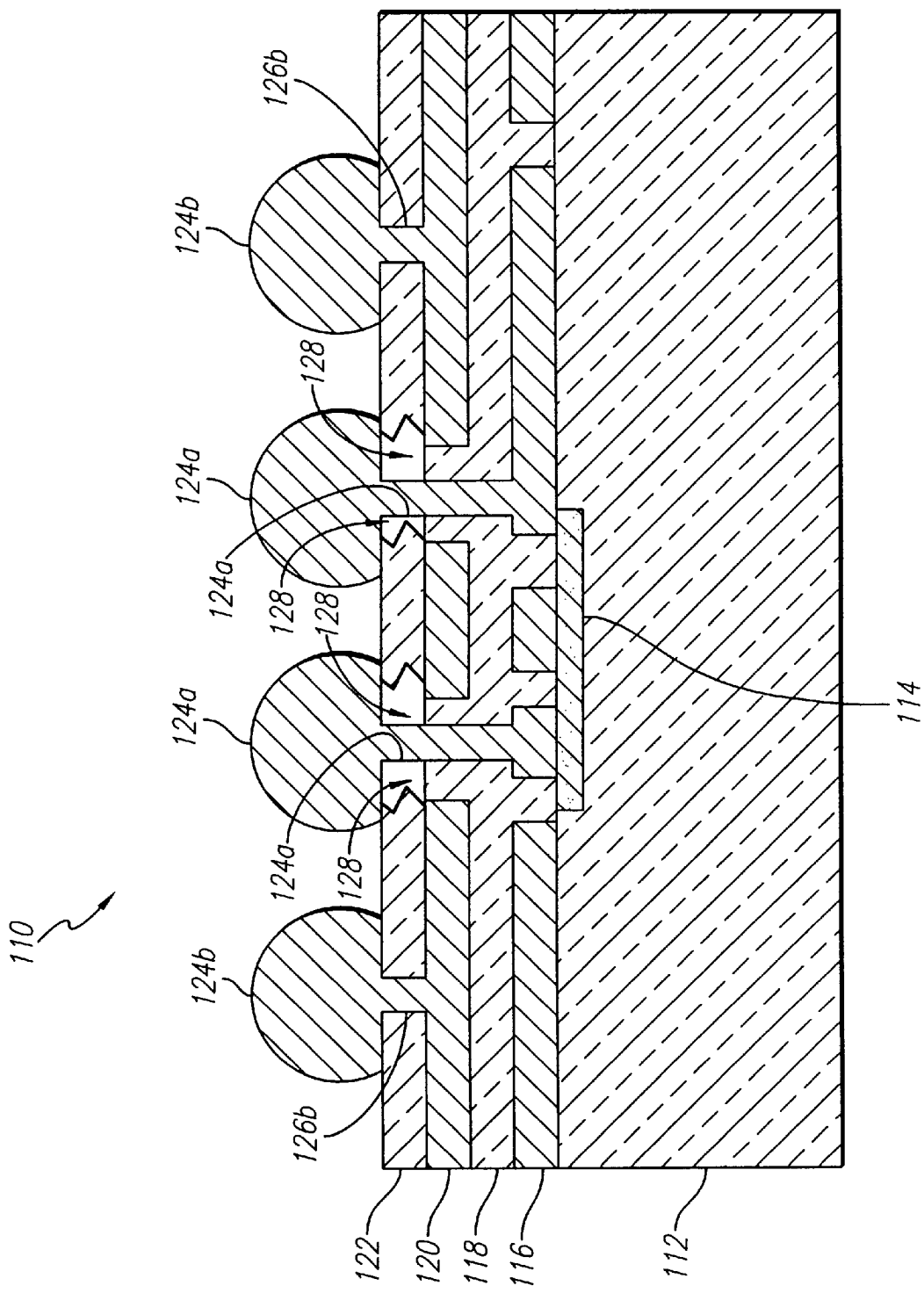
FIG. 1 is a simplified sectional view illustrating a flip-chip integrated circuit according to the present invention.

A first embodiment of an integrated circuit 110 including a thin film electrostatic discharge protection structure according to the present invention is illustrated in FIG. 1. While the circuit 110 is illustrated as having a flip-chip configuration, the invention is not so limited.

The circuit 110 comprises a semiconductor substrate 112 with a large number of microelectronic devices such as MOSFETs formed thereon. Only one device is symbolically shown for simplicity of illustration, and designated by the reference numeral 114. An electrically-conductive metal signal layer 116 is formed on the substrate 112, and patterned to provide the required logical functionality. The signal layer 116 is appropriately connected to the devices (e.g. at 114). A dielectric layer 118 of silicon dioxide or the like is formed on the signal layer 116, and is also suitably patterned. A metal plane layer 120, which may be a power or ground plane, is formed on the dielectric layer 118.

In accordance with the present invention, an ESD protection layer 122 is formed on the plane layer 120. The protection layer 122 is a thin film of a polymer or other suitable material which is normally dielectric, but is rendered conductive by a high applied electrostatic potential such as occurs during an ESD event. Although the scope of the present invention is not limited to any particular material, a preferred material for the protection layer 122 is SurgX™, which is commercially available from the Oryx Technology Corporation of Fremont, Calif. In the illustrated example, the thickness of the protection layer 122 is on the order of two micrometers.

External connection to the device 114 is provided by an array of terminals in the form of solder balls 124a and 124b. The balls 124a and 124b are identical, and are designated by different reference numerals only because the balls 124a are connected to the signal layer 120 by electrically conductive vias 126a and the balls 124b are connected to the plane layer 120 by vias 126b. It will be understood for the purpose of the present invention that the term "solder balls" is generic to elongated solder columns in addition to round balls as illustrated, as well as other similar configurations.

Vertical electrical discharge paths 128 having a length of two micrometers are defined in the protection layer 122 between lateral portions of the solder balls 124a and the underlying portions of the plane layer 120. The protection layer 122 is normally dielectric, and does not affect the functional operation of the integrated circuit 110. However, in response to an applied high electrostatic potential during an ESD event, the protection layer 122 becomes temporarily conductive, and shunts the ESD potential from the solder ball 124a to which the potential is applied away from the device 114 to the plane layer 120 through the respective discharge path 128.

In accordance within the present invention, the ESD potential is thereby not applied to the device 114, and therefore the device is not damaged. The material of the protection layer 122 is selected such that the resistance thereof increases back to its initial level, and the protection layer again becomes dielectric, after the ESD potential is removed. An ESD potential applied to the one of the solder balls 124b does not pass through the protection layer 122, but instead is conducted directly to the plane layer 120 through the respective via 126b.

Figure 2:
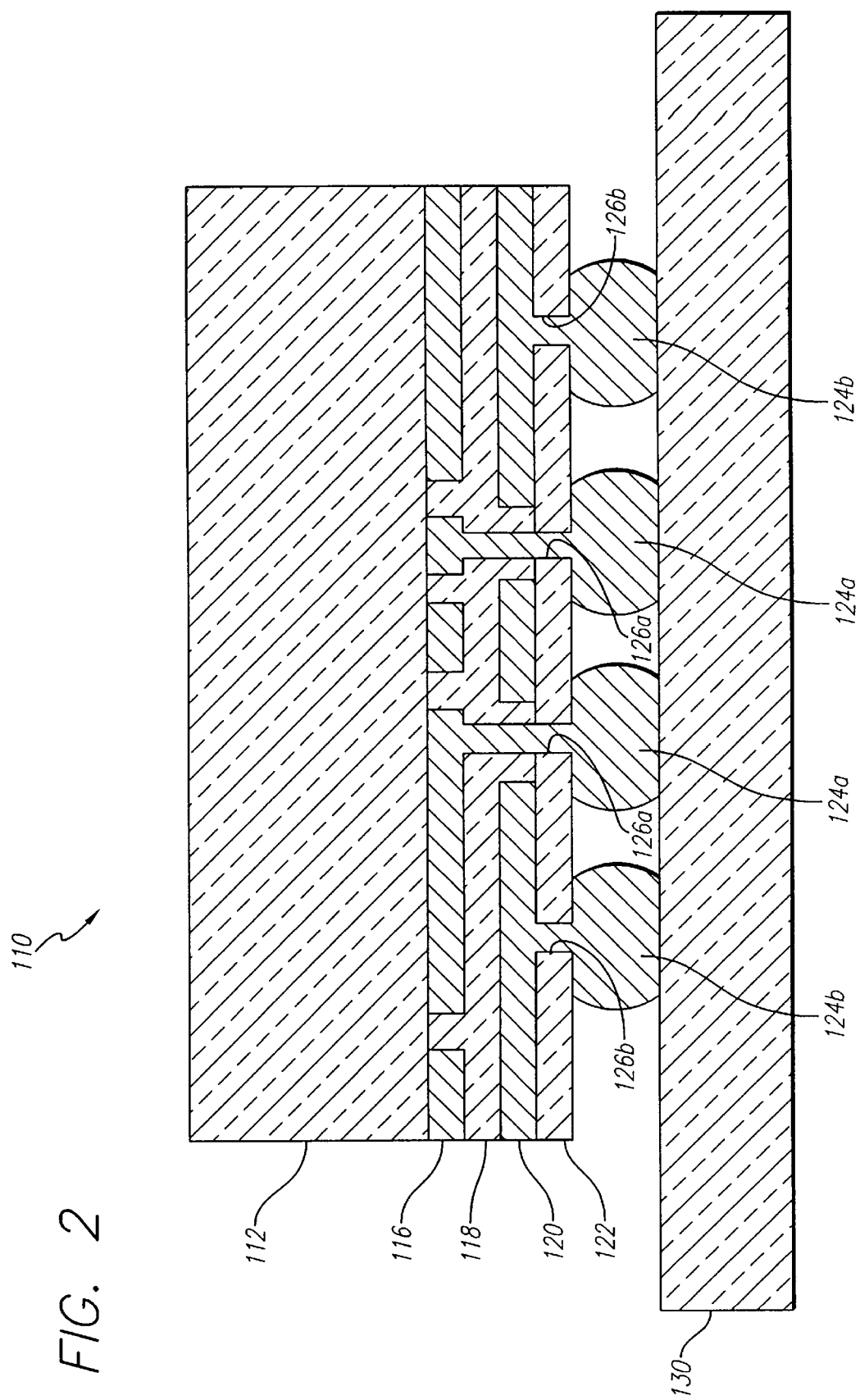
FIG. 2 is a simplified sectional view illustrating a flip-chip integrated circuit of FIG. 1 mounted on a circuit board.

FIG. 2 is similar to FIG. 1, and further illustrates the integrated circuit 110 as being operatively mounted on a printed circuit board 130 via the solder balls 124a and 124b in a flip-chip arrangement.

Figure 3:
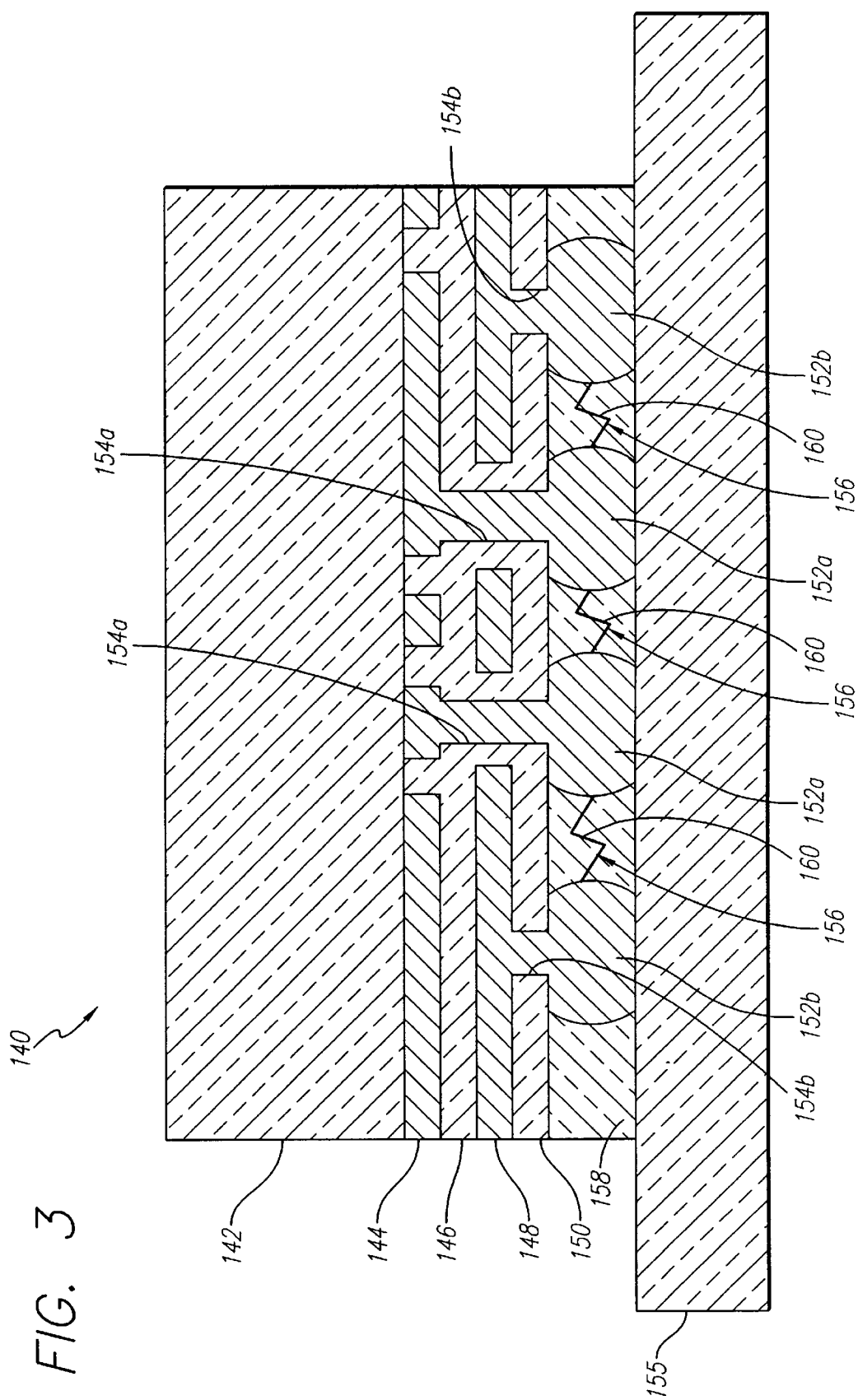
FIG. 3 is a simplified sectional view illustrating another flip-chip integrated circuit of the present invention mounted on a circuit board.

FIG. 3 illustrates another integrated circuit shown generally at 140 according to the present invention, in which the electrical discharge paths in the protection layer are lateral rather than vertical. The circuit 140 comprises a semiconductor substrate 142 having microelectronic devices (not shown) formed thereon.

An electrically-conductive metal signal layer 144 is formed on the substrate 142, is patterned to provide the required logical functionality, and is appropriately connected to the devices as described above. A dielectric layer 146 of silicon dioxide or the like is formed on the signal layer 144, and a metal plane layer 148, which may be a power or ground plane, is formed on the dielectric layer 146. Another dielectric layer 150 is formed on the plane layer 148.

External connection to the devices is provided by an array of terminals in the form of solder balls 152a and 152b. The balls 152a are connected to the signal layer 144 by vias 154a, and the balls 152b are connected to the plane layer 148 by vias 154b. The integrated circuit 140 is mounted on a chip package substrate or printed circuit board 155 via the solder balls 152a and 152b.

In the integrated circuit 140, the lateral spaces between the solder balls 152a and 152b are filled with an electrostatic discharge protection layer 158 formed of a material such as SurgX™ as described above. These spaces constitute lateral electrical discharge paths 156 through which an applied ESD potential is shunted from the balls 152a to the plane layer 148 as indicated at 160. More specifically, an ESD potential applied to a solder ball 152a causes the material of the protection layer 158 to become conductive as at 160, and provide an electrical path between the solder ball 152a to an adjacent solder ball 152a or 152b.

If a directly adjacent solder ball is ball 152b, and is thereby connected to the plane layer 148, this connection causes the ESD potential to be shunted from the solder ball 152a, through the respective discharge path 156, solder ball 152b and via 154b to the plane layer 148. Thus, the ESD potential is prevented from reaching the devices on the substrate 142. If no solder ball 152b is directly adjacent to a solder ball 152a to which an ESD potential is applied, the potential will be shunted through electrical discharge paths 156 and one or more solder balls 152a to the one of the solder balls 152b and thereby to the plane layer 148.

Although the present invention is not limited to any specific dimensions, the solder balls 152a and 154b preferably have a diameter of four mils (0.01 millimeter), and are spaced from each other at a pitch of eight mils (0.02 millimeter). Thus, the lateral discharge paths 156 have a length of four mils (0.01 millimeter).

Figure 4:
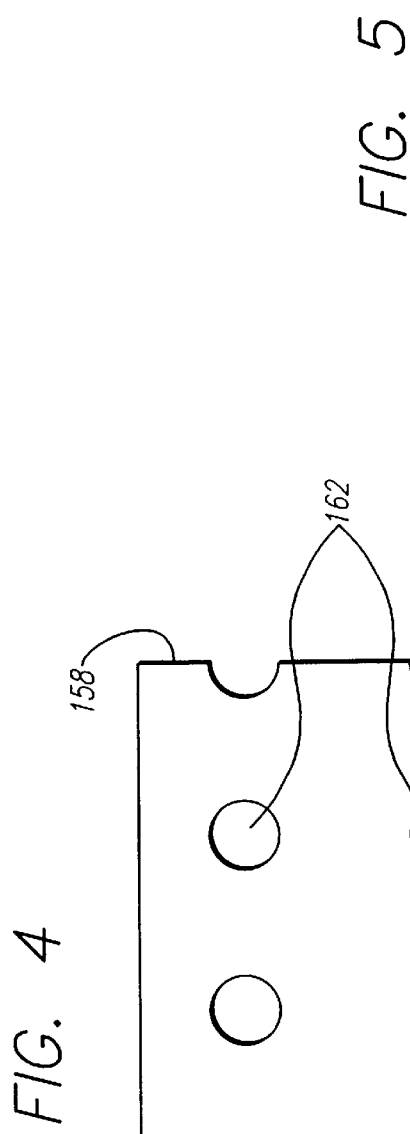
FIG. 4 is a plan view illustrating in isolation a patterned ESD protection layer according to the present invention.

FIG. 4 is a plan view illustrating in isolation the pattern configuration of the protection layer 158 for a flip-chip solder ball grid array as described above. The protection layer 158 is formed with openings 162 for the solder balls 152a and 152b.

Figure 5:
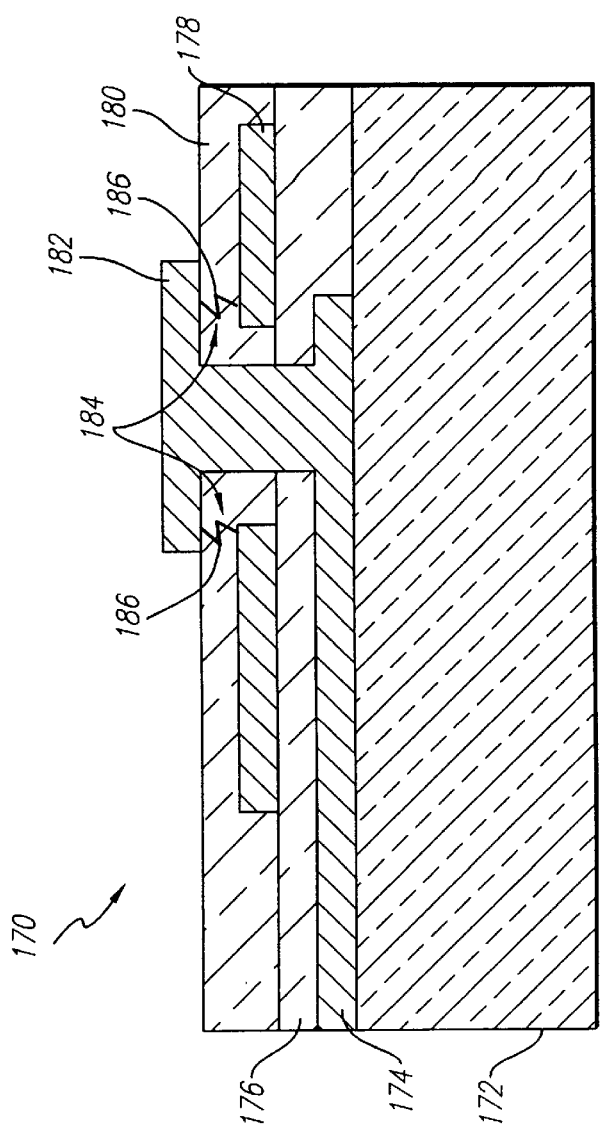
FIG. 5 is a simplified sectional view illustrating a wire bond connection integrated circuit according to the present invention.

FIG. 5 illustrates another integrated circuit generally at 170 embodying the present invention, including a substrate 172, signal layer 174, dielectric layer 176, power or ground plane layer 178, and ESD protection layer 180 substantially as described above. The circuit 170 differs from the other embodiments of the invention in that the terminals, rather than being solder balls, are wire bond pads 182 having lateral portions which overlie electrical discharge paths 184 in the protection layer 180. In response to an ESD event, the discharge paths 184 become conductive as indicated at 186 to shunt the ESD potential from the wire bond pad 182 to the plane layer 178.

The integrated circuits described above are fabricated by the steps of forming the devices in the substrate, forming and patterning the metal, dielectric and protection layers on the substrate, and forming the terminals over the protection layers in the illustrated configurations.

The protection layer can also be used as part of the semiconductor package construction. As will become more apparent from FIGS. 6–8 and the detailed discussion thereof provided later, the protection layer is positioned where a breakdown path can exist. Thereby when there is an ESD event, a differential voltage is applied across the protection layer. For example, the protection layer can be positioned between a signal lead and a ground lead; or a signal lead and a power plane; or a lead and an adjacent lead if that adjacent lead has a voltage, like ground, different from the lead being hit by the event; or a lead and a ground or power plane, which is tied in so that a field is created across the protection layer. The protection layer can then breakdown and clamp the signal and prevent it from damaging the integrated circuit(s).

The material of any of the protection layers discussed herein can be the SurgX™ material as previously discussed. It also can be any of the materials as disclosed in the previously-mentioned '924 and '922 PCT publications. For example, the voltage variable material can be a voltage variable thick film paste typically comprised of 50% solvent and 50% solids coating, the solid phase of which is comprised of 38% by weight (30% by volume) of conductors such as ten micron aluminum, 3.5% by weight (3.4% by volume) silica coating for the conductors, and 58.5% by weight (66.6% by volume) of reinforced fluoro-silicone polymer whose dielectric breakdown strength has been modified through the addition of antioxidants and stabilizers such as specifically-sized aluminum oxide. The size of the aluminum oxide can range from 0.01 to 5 microns. The voltage variable material can also be a solid which is laminated to the reinforcing mat.

The breakdown of SurgX™ material is proportional to its thickness, behaving in that respect like other dielectrics. That is, the thicker the material is the higher the voltage required to break it down. Thus, the present invention provides that the thickness can be selectively controlled to allow for clamping in one place but not another, allowing "intelligent" packages to be designed. However, the layer or material must still be positioned to define a discharge path with a ground plane or the like on the other side of the signal lead to be protected.

Figure 6:
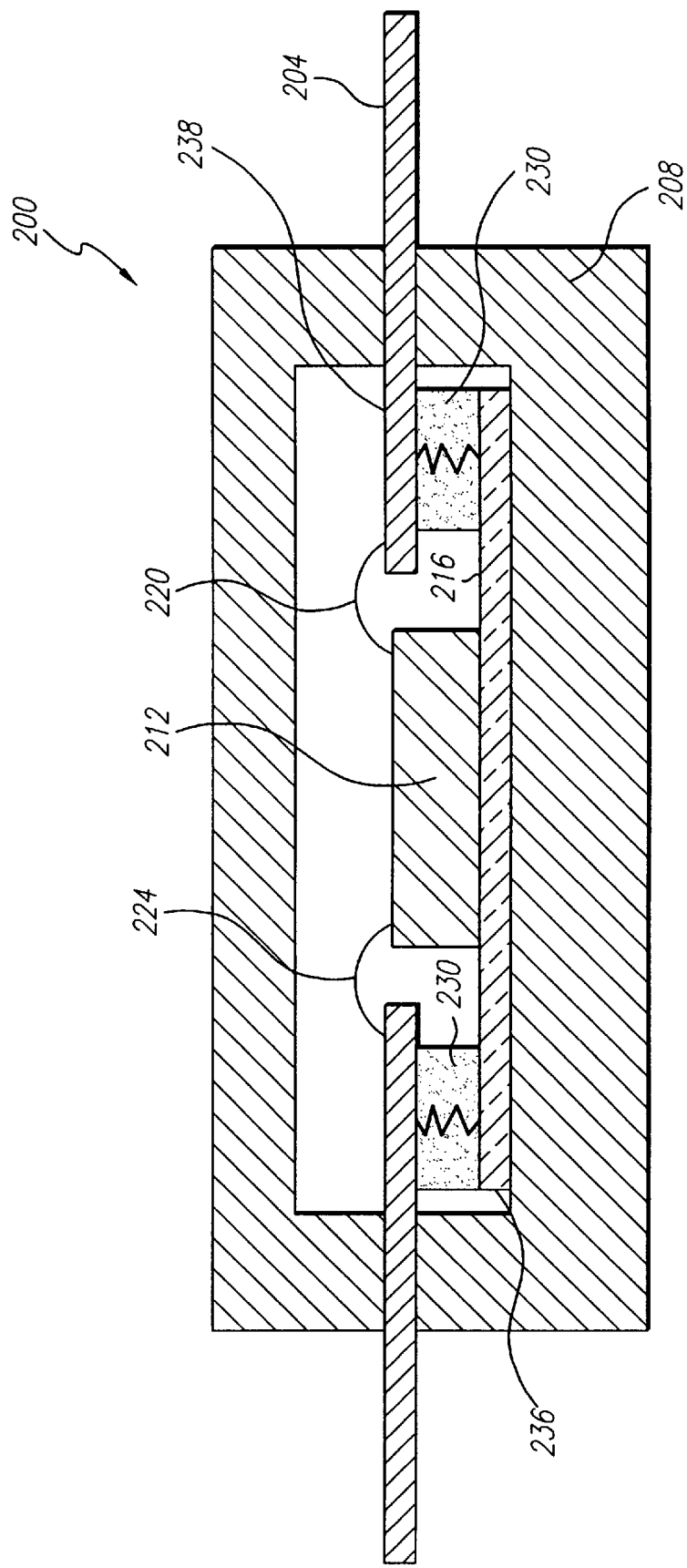
FIG. 6 is a simplified sectional view illustrating a microelectronic package of the present invention.

An example of a semiconductor flat package of the present invention is illustrated in FIG. 6 generally at 200, and can be a plastic quad flat pack, for example. As shown in simplified form therein, the package signal leads 204 extend out of the package body 208 in a known manner. The integrated circuit die 212 is supported on the power plane 216. Wire bonds 220, 224 operatively connect the integrated circuit die 212 and the signal leads 204.

The ESD protection material 230 is disposed sandwiched between interior ends of the signal leads 204 and outer edge portions of the power plane 216. Thus when an ESD event acts on the exterior ends of one or more of the signal leads 204, a potential is created between that lead and the power plane 216. The protection material 230 immediately breaks down as shown at 236 and 238, the voltage is shunted to the power plane 216, and the IC die 212 is thereby protected.

One method of manufacturing the package 200 is to incorporate the protection material in a tape construction, similar to tape ball grid arrays manufactured by LSI Logic Corporation of Milpitas, Calif. or by IBM. The protection material would be the basic substrate of this tape or two-sided flexible film. Metal layers are formed on both sides of the substrate. One side is patterned into the ground plane (or power plane or paddle). The other side is patterned into the bond fingers. A hole is cut in the tape to form a die well. The die is then mounted in the die well. Alternatively, the outer edges of the tape can be patterned to form the signal fingers after the die well is cut. The (plastic or ceramic) package is then formed around it.

Alternatively, manufacturing methods other than tape constructions can be used. For example, a metal sheet or layer can be placed or otherwise deposited on a substrate. The protection material is then coated on top of this metal sheet, and a conventional lead frame is laid down on top of the protection layer to make a sandwich construction. The sandwich construction is then enclosed in the protective package body.

Figure 7:
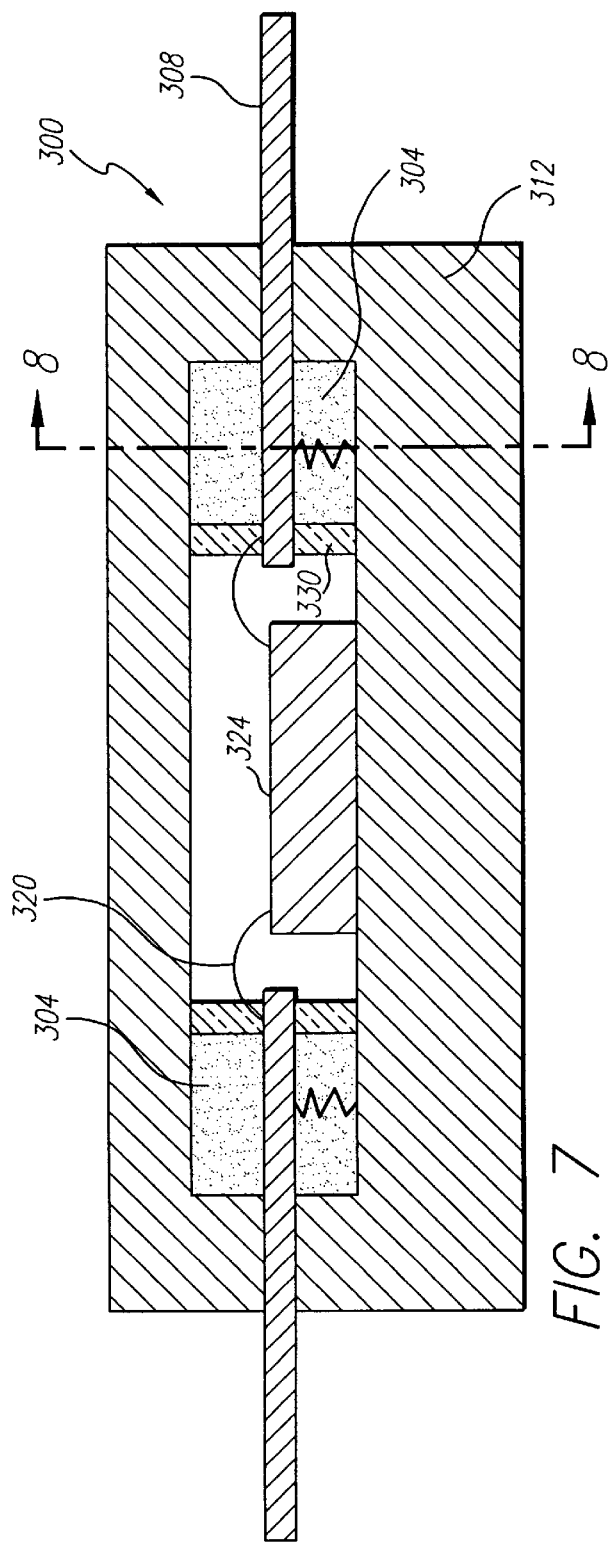
FIG. 7 is a simplified sectional view illustrating another microelectronic package of the present invention.
Figure 8:
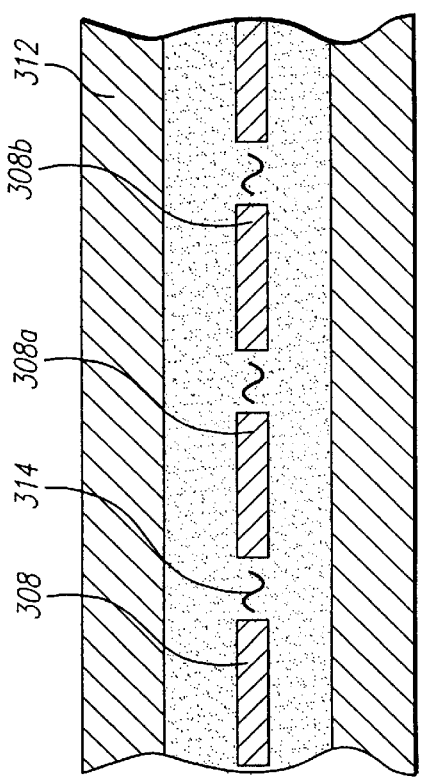
FIG. 8 is an enlarged cross-sectional view taken on line 8—8 of FIG. 7.

Another embodiment of the present invention is shown in FIGS. 7 and 8 by semiconductor package 300. This package 300 differs from package 200 of FIG. 6 in that the protection material or layer 304 is positioned between the signal leads 308, but is still enclosed within the package body 312. The interior or inside ends of the leads 308 are embedded or encapsulated in the protection material layer 304. When the end or ends of one or more of the leads are subjected to an ESD charge, the protection layer 304 breaks down and the charge travels as at 314 to the adjacent leads (e.g., 308a) or onto further adjacent leads (e.g., 308b). This can best be understood from FIG. 8. The ESD charge thereby is not transmitted via the wire bonds 320 to the integrated circuit die 324, which would damage or destroy the chip.

A number of different ways of constructing the package 300 are within the scope of this invention. One way is to construct it as a conventional semiconductor package but with a peripheral dam 330 built therein. The protection material is then injected into the package between the package wall and the dam 330; that is, between the tips of the lead fingers to form the protection layer. The polymer material is chemically dissolved before injection.

The above-mentioned conventional semiconductor package can be formed with a metal lead frame whose signal leads are punched or etched out to form a pattern of fingers. The fingers are tied together inside a frame. A die is attached to a paddle portion of the frame. The die is then wire bonded to the die, and the plastic or ceramic package is enclosed around it or the like.

Other ways of manufacturing the polymer in the package are to chemically dissolve it into a liquid. The liquid is then painted or screened into position, and allowed to cure into a film or tape.

Figure 9:
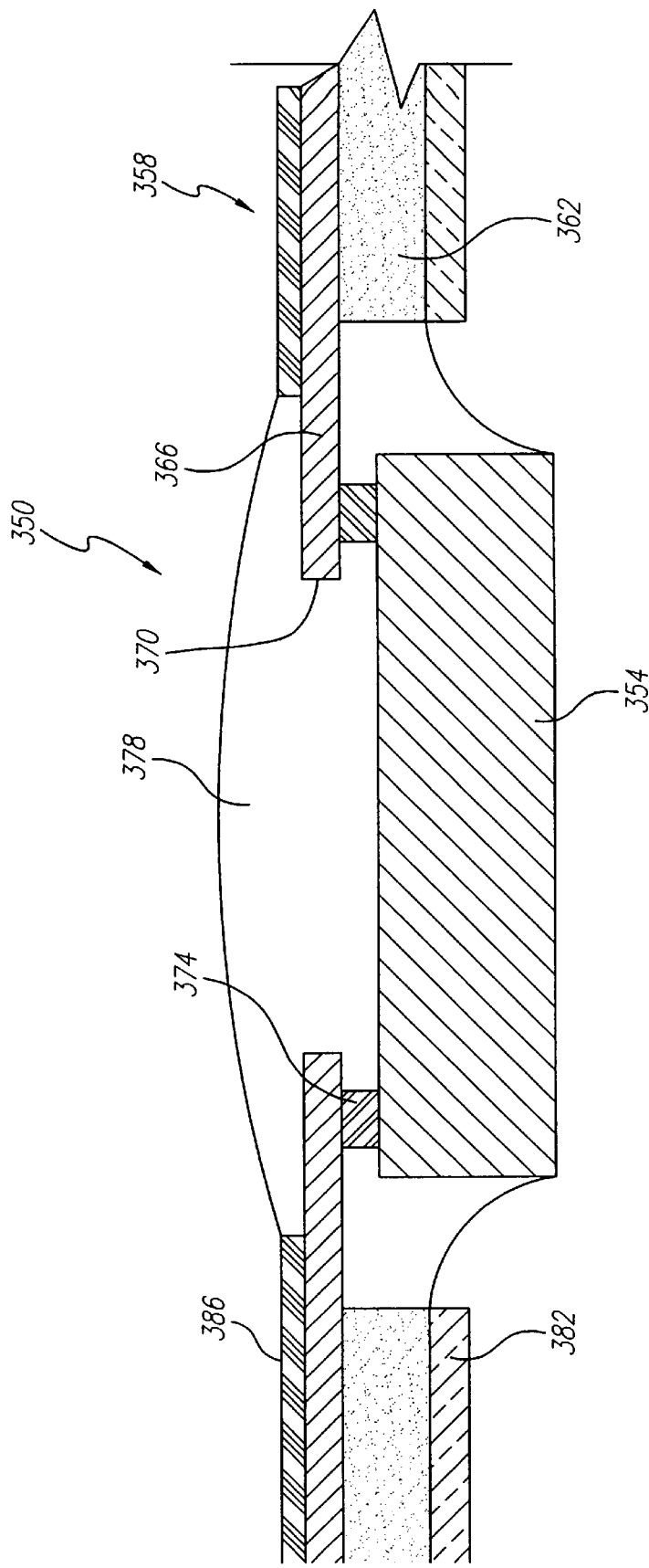
FIG. 9 is a simplified sectional view illustrating a chip-on-tape integrated circuit of the present invention.
Figure 10:
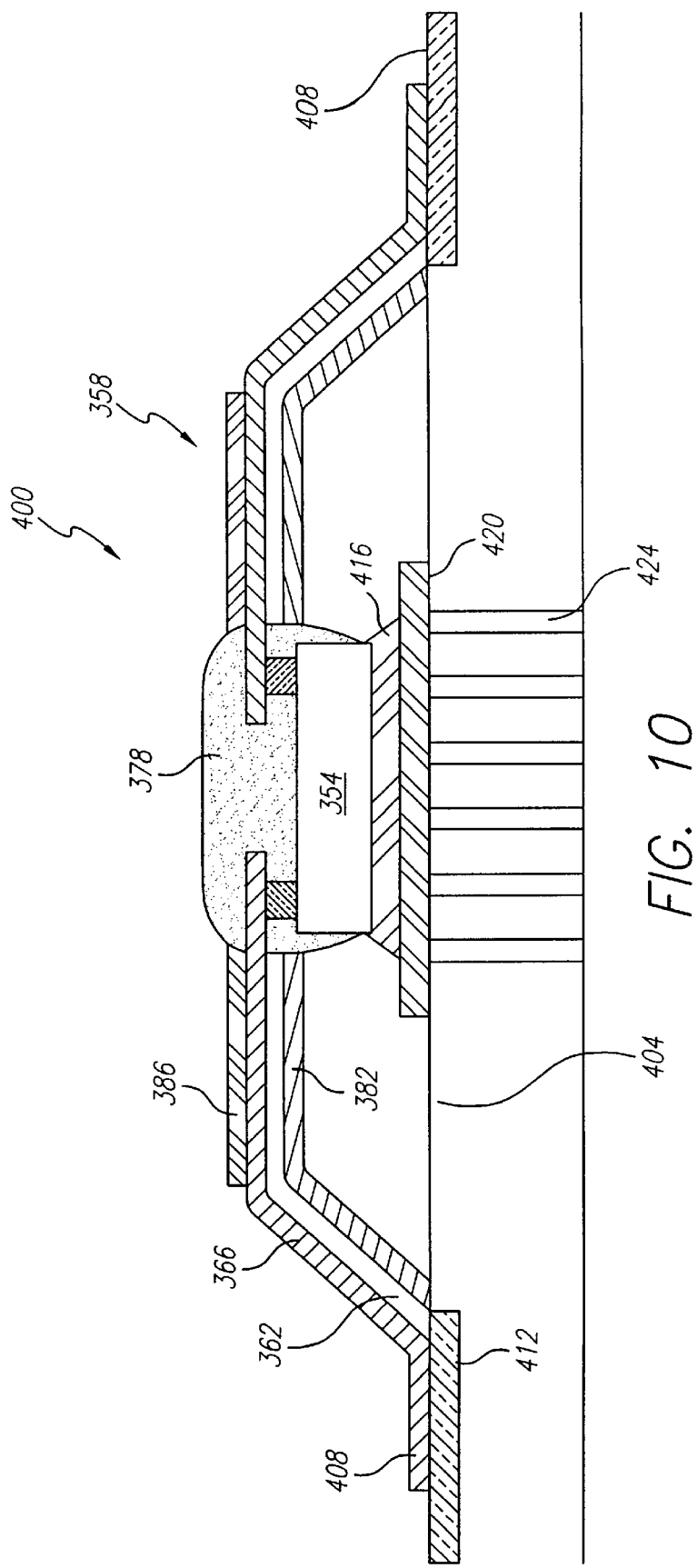
FIG. 10 is a simplified sectional view illustrating an integrated circuit similar to that of FIG. 9 shown mounted on a printed circuit board.

As previously mentioned, the protection layer or material can be assembled into the circuit or package with a tape, chip-on-tape or tape automated bonding (TAB) type of construction. This is shown in FIGS. 9 and 10 and is a surface mount package option for high pin count devices. Referring first to FIG. 9, illustrated therein generally at 350 is a chip-on-tape integrated circuit of the invention. Briefly, circuit 350 includes a die 354 and a tape shown generally at 358. Tape 358 includes a thin layer 362, made of any of the protection materials mentioned in this disclosure (instead of the polyimide material often used in chip-on-tape constructions). A layer of thin conductive leads 366 is bonded to the substrate layer 362 and has an opening 370, generally of rectangular configuration, to generally mate with the rectangular configuration of the die 354. Gold bumps 374 are "grown" on the bond pads of the die 354. The inner ends of the leads 366 are thermosonically bonded to the bumps 374. (Other methods of electrically connecting the die to the leads as would be apparent to those skilled in the art are within the scope of the invention and incorporated herein.) A die coat or encapsulant 378 comprising a thin layer of epoxy, for example, covers the top side of the die 354 and the inner ends of the leads 366 to protect them from contamination.

The tape 358 further includes an electrically conductive layer 382 bonded to the protection substrate layer 362 on the side thereof opposite to the lead layer 366. It preferably terminates at the die coat 378 and covers the entire length of the tape 358 and defines a solid plane around the tape. A solder resist layer 386 can optionally be provided on top of the lead layer 366.

This die (chip) 354 with the tape 358 can be mounted directly on a printed circuit (PC) board, in a package or elsewhere as would be apparent to those skilled in the art. The electrically conductive layer 382 is connected to ground, external to and off of the die; for example, to the board or in the package.

The conductive leads 366 of the tape 358 extend laterally outwardly of all four outer sides of the tape and project downwardly below the die 354. Thereby, they are positioned for resting upon and electrically contacting contact pads formed on another electrical component, such as a PC board, as discussed with reference to FIG. 10.

FIG. 10 shows generally at 400 a chip-on-tape integrated circuit mounted on a PC board 404. Although the circuit is slightly different from that of FIG. 9, similar or corresponding elements are designated with the same reference numerals. As shown, the laterally outwardly and depending free ends 408 of the leads are bonded to the conductive pads or traces 412 of the PC board 404 for physical and electrical connection, and hold the tape 358 (including the electrically-conductive layer 382) spaced above the board 404. In the embodiment illustrated in FIG. 10 thermally-conductive adhesive 416 attaches the die 354 to a metal plate 426 of the board. Thermal vias 424 through the board ventilate and cool the die 354. A back-mounted heat sink can be attached to the board 404 to further improve heat dissipation.

The electrically-conductive layer 382 is tied to ground and thereby operates as a ground plane. Thus, when an ESD charge impacts the leads, 366, the protection layer 362 breaks down and the charge passes therethrough to the electrically-conductive layer 382 and on to ground. The charge is thereby directed away from the die 354, preventing damage thereto. In other words, when one of the leads 366 experiences a voltage spike, the protection layer 366 due to the variable voltage protection capabilities thereof conducts the spike away from the chip or die 354 to protect same.

SurgX™, which is the preferred protection material, becomes conductive at about between twenty and thirty volts and remains conductive until the voltage drops below the clamp voltage. In addition to being sensitive to the size of the electric field or voltage level, it is sensitive to the rate at which the voltage is applied to it. Thus, when it is hit suddenly, like with an ESD event, it goes from almost infinite impedance to a short circuit until the voltage drops below the clamp voltage. It then returns to its normal very high impedance.

Thus, the present invention employs a material, such as SurgX™, which goes from an almost natural impedance down to almost zero impedance under an ESD event, immediately recovers, and does so through multiple cycles. By using a properly-designed and positioned layer of this material, the prior art circuit techniques for protecting against ESD events are not needed. With these clamping devices eliminated from the die, the die is made smaller, saving money.

In other words, this invention concerns the application of this polymer (or a similar material) in an IC package to directly protect the IC chip from ESD discharge. Active on-board or on-chip ESD protection circuits are thus not required or the requirements therefor are not stringent. The polymer can be deposited in any manner, such as between signal leads and power planes or, between signal leads and signal leads, to provide a conductive discharge path through the polymer or similar material when the resistance switches from very high to near zero upon an ESD event.

The ESD event protected package may contain any known semiconductor device die including CMOS integrated circuits. The package can be any type having multiple leads including PQFP, QFP, TQFP, ball grid array, and even two-lead transistor packs. It can also include multichip modules, and flip chip, wire bonded or tape assembled devices. The ESD protection polymer can be constructed as an integral part of the package, can be added during the assembly process or can be part of a TAB tape assembly. Also included in this invention are systems which include such ESD protected die or packages, such as computers, telecon systems, MCMs and communications systems.

From the foregoing detailed description, it will be evident that there are a number of changes, adaptations and modifications of the present invention which come within the province of those skilled in the art. However, it is intended that all such variations not departing from the spirit of the invention be considered as within the scope thereof as limited solely by the claims appended hereto.

What is claimed is:

1. A semiconductor device, comprising:
   an integrated circuit die; and
   a tape construction including a layer of leads operatively connected to said die, an electrically conductive layer, and a protection layer sandwiched between said layer of leads and said electrically-conductive layer;
   wherein said protection layer comprises a material which is normally dielectric but becomes temporarily conductive when an electrostatic discharge potential is applied thereto, such that when the potential is applied to one of the leads, the potential is shunted through said protection layer to said electrically conductive layer to protect said die; and wherein said protection layer comprises a flexible film of said material.

2. The device of claim 1 wherein said material is a polymer.

3. A semiconductor device, comprising:

an integrated circuit die; and a tape construction including a layer of leads operatively connected to said die, an electrically conductive layer, and a protection layer sandwiched between said layer of leads and said electrically-conductive layer;

wherein said protection layer comprises a material which is normally dielectric but becomes temporarily conductive when an electrostatic discharge potential is applied thereto, such that when the potential is applied to one of the leads, the potential is shunted through said protection layer to said electrically conductive layer to protect said die;

wherein said protection layer comprises a substrate layer of said material; and wherein said layer of leads is bonded to said substrate layer of said material.

4. The device of claim 3 wherein said electrically-conductive layer is bonded to said substrate layer of said material on the opposite side as said layer of leads.

5. The device of claim 4 further comprising encapsulant covering ends of said leads.

6. A semiconductor device, comprising:

an integrated circuit die;

a first signal lead electrically connected to said die;

a second signal lead adjacent to but spaced from said first signal lead; and protection material between said first and second signal leads;

wherein said protection material is normally dielectric but becomes temporarily conductive when an electrostatic discharge potential is applied thereto, such that when the potential is applied to said first signal lead the potential is shunted through said material to said second signal lead to protect said die; and wherein said material is a polymer.

7. A semiconductor device, comprising:

an integrated circuit die;

a first signal lead electrically connected to said die;

a second signal lead adjacent to but spaced from said first signal lead;

protection material between said first and second signal leads;

wherein said protection material is normally dielectric but becomes temporarily conductive when an electrostatic discharge potential is applied thereto, such that when the potential is applied to said first signal lead the potential is shunted through said material to said second signal lead to protect said die; and a package enclosing said die, said leads extending out of said package and said material being enclosed in said package;

wherein said material is injected into position in said package between said leads.

8. The device of claim 7 further comprising a dam in said package providing a back wall for said injected material.

9. A semiconductor device, comprising:

a power plane;

an integrated circuit die supported on said power plane;

a protection layer supported on said power plane and spaced laterally from said die; and a lead on top of said protection layer and wire bonded to said die;

wherein said protection layer is formed of material which is normally dielectric and which becomes temporarily conductive when an electrostatic discharge potential is applied thereto;

wherein said protection layer is sandwiched directly between said lead and said power plane to shunt an electrostatic discharge potential on said lead to said power plane to thereby protect said die; and wherein said material comprises a polymer.

10. A semiconductor device, comprising:

a power plane;

an integrated circuit die supported on said power plane;

a protection layer supported on said power plane and spaced laterally from said die; and a lead on top of said protection layer and wire bonded to said die;

wherein said protection layer is formed of material which is normally dielectric and which becomes temporarily conductive when an electrostatic discharge potential is applied thereto;

wherein said protection layer is sandwiched directly between said lead and said power plane to shunt an electrostatic discharge potential on said lead to said power plane to thereby protect said die; and wherein said material comprises a film of said material.

* * * * *